(12) United States Patent
Hsieh et al.

(10) Patent No.: US 10,283,725 B2
(45) Date of Patent: May 7, 2019

(54) ORGANIC SCHOTTKY DIODES

(71) Applicant: PALO ALTO RESEARCH CENTER INCORPORATED, Palo Alto, CA (US)

(72) Inventors: Bing R. Hsieh, Pleasanton, CA (US); Tse Nga Ng, Sunnyvale, CA (US); Gregory Whiting, Menlo Park, CA (US)

(73) Assignee: Palo Alto Research Center Incorporated, Palo Alto, CA (US)

(*) Notice: Subject to any disclaimer, the term of this patent is extended or adjusted under 35 U.S.C. 154(b) by 0 days.

(21) Appl. No.: 15/837,843

(22) Filed: Dec. 11, 2017

(65) Prior Publication Data

US 2018/0114932 A1 Apr. 26, 2018

Related U.S. Application Data

(62) Division of application No. 14/294,929, filed on Jun. 3, 2014, now abandoned.

(51) Int. Cl.
*H01L 51/05* (2006.01)
*H01L 51/00* (2006.01)

(52) U.S. Cl.
CPC ...... *H01L 51/0579* (2013.01); *H01L 51/0003* (2013.01)

(58) Field of Classification Search
CPC .................. H01L 29/66143; H01L 29/6603
See application file for complete search history.

(56) References Cited

U.S. PATENT DOCUMENTS

| | | | |
|---|---|---|---|
| 2005/0212072 A1 | 9/2005 | Lee et al. | |
| 2008/0179742 A1 | 7/2008 | Muller et al. | |
| 2008/0237608 A1* | 10/2008 | Richieri | H01L 29/24 257/77 |
| 2011/0017981 A1 | 1/2011 | Bradley et al. | |
| 2011/0129607 A1* | 6/2011 | Lee | C23C 18/54 427/287 |
| 2013/0213690 A1* | 8/2013 | Lee | B05D 5/12 174/126.4 |
| 2014/0106516 A1 | 4/2014 | Curatola et al. | |
| 2015/0349281 A1 | 12/2015 | Hsieh et al. | |
| 2017/0279046 A1* | 9/2017 | Burroughes | H01L 51/0005 |

OTHER PUBLICATIONS

X-M Cheng et al., "Fabrication and Characterization of C60-Based Organic Schottky Diodes", 2010, Chinese Physics Letters, vol. 27, pp. 017303-1-017303-3 (Year: 2010).*

I. Tascioglu et al., "Frequency Dependent Electrical and Dielectric Properties of AU/P3HT:PCBM:F4-TCNQ/n-Si Schottky Barrier Diode", Jan. 31, 2017, Journal. of Electronic Materials, vol. 46, pp. 2379-2386 (Year: 2017).*

(Continued)

*Primary Examiner* — Michael Lebentritt
*Assistant Examiner* — Suberr L Chi
(74) *Attorney, Agent, or Firm* — Miller Nash Graham & Dunn LLP

(57) ABSTRACT

An organic diode has a substrate, a first conductor layer on the substrate, an organic semiconductor layer on the first conductor layer, and a second conductor layer on the organic substrate layer, wherein one of the conductor layers has an injection enhancement.

7 Claims, 7 Drawing Sheets

(56) References Cited

OTHER PUBLICATIONS

Di et al, "Efficient modification of Cu electrode with nanometer-sized copper tetracyanoquinodimethane for high performance organic field effect transistors", 2008, Phys. Chem. Chem. Phys., vol. 10, pp. 2302-2307.

Humphrey et al, Electrically conducting TCNQ derivatives of Copper Sulphur/Nitrogen Chelates; Structure of a Novel Semiconductor Complex. . J. Chem. Soc., Chem. Comm., 1988, Issue 20, pp. 1356-1358.

* cited by examiner

ORGANIC SCHOTTKY DIODES

CROSS REFERENCE TO RELATED APPLICATION

This application is a divisional of and claims priority to U.S. patent application Ser. No. 14/294,929, filed Jun. 3, 2014, which is incorporated herein by reference in its entirety.

BACKGROUND

Schottky diodes typically have a metal-semiconductor junction rather than a semiconductor-semiconductor junction. They typically have a low forward voltage drop. These diodes may consist of organic materials. Organic Schottky diodes may have an organic semiconductor layer sandwiched between a single or multi-layered stack of injecting contact (IC) and a blocking contact (BC), designated IC/OSL/BC. An example of such a diode is shown in FIG. 1. FIG. 1 shows a prior art embodiment of an organic Schottky diode 10. The diode has an injecting contact 14 on a substrate 12. The organic semiconductor layer 16 resides on the injecting contact layer. The blocking contact 18 resides on the organic semiconductor layer. Materials for the organic semiconductor layer include both p-type and n-type organic semiconducting polymeric or molecular materials and the IC and BC can each consist of at least a conductive layer such as indium-tin-oxide (ITO), gold, silver, copper, aluminum, nickel, and palladium.

Solution processing techniques, such a printing, spin coating, etc., work well with organic polymer Schottky diode processes. Because of this, these have become prevalent, including those based on pi conjugated polymers such as poly(phenylene vinylenes) (PPVs) and poly(thiophenes) such as ITO/PPV/Al, ITO/PEDOT-PSS/MEH-PPV/Au, ITO/MEH-PPV:C60/Ca, ITO/P3HT/Au and the like. Recently poly(triarylamine) (PTAA) and its derivatives have become one of the most popular semiconducting polymer classes, because of their ease of processing, stability and outstanding charge transport properties.

DETAILED DESCRIPTION OF THE EMBODIMENTS

Figure 1:
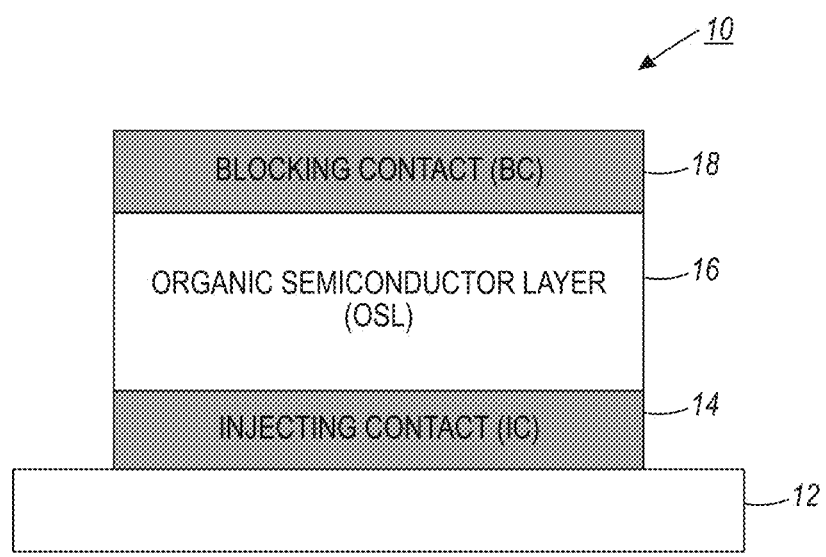
FIG. 1 shows a prior art embodiment of an organic Schottky diode.
Figure 2:
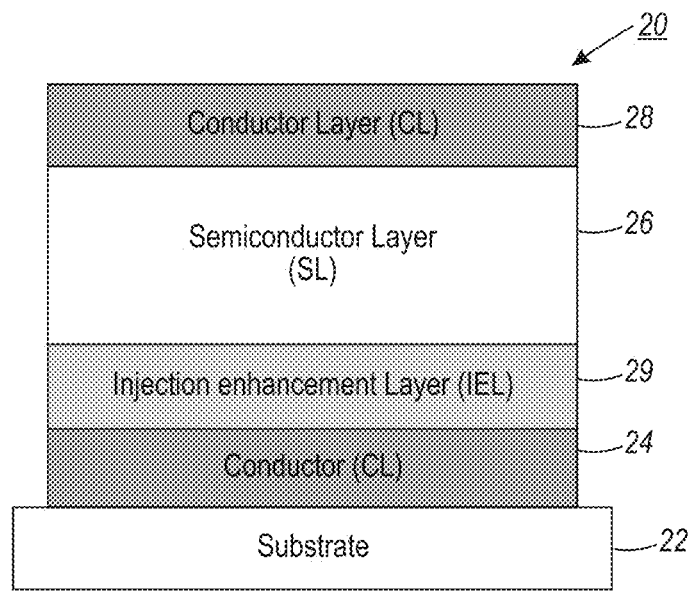
FIG. 2 shows an embodiment of an organic Schottky diode having an injection enhancement.

FIG. 2 shows an embodiment of an organic Schottky diode 20. The diode has a substrate 22, a first conductor 24, a semiconductor 26 and a second conductor 28, similar to the prior structure. In this embodiment, the conductor layer 24, sometimes referred to as the injecting contact layer, has an injection enhancement layer between the conductor and the semiconductor layer. The injection enhancement layer modifies the work function of the conductive layer to achieve, ideally, an Ohmic contact.

The conductor layer may consist of silver, gold, copper, nickel, aluminum, indium-tin-oxide, conductive carbon materials, silver nanowires, etc. The organic semiconductor layer may consist of pi conjugated polymers such as poly(triarylamines) (PTAA), poly(phenylene vinylenes), poly(thiophenes), triarylamine containing polymers, ferrocene containing polymers, polysilanes, and triarylamine molecularly doped polymers. The injection enhancement layer and injection enhancement additive include TCNQ (tetracyanoquinodimethane) and its derivatives, LiF (lithium fluorine), $Li_2CO_3$ (lithium carbonate), CsF (cesium fluoride), $Cs_2CO_3$ (cesium carbonate). Substrate materials may include high temperature thermal plastics, such as PET (polyethylene terephthalate) and PEN (polyethylene napthalate), glass and silicone.

In some particular embodiments, the conductor 24 consists of silver, and the injection enhancement layer consists of 2,3,5,6-tetrafluoro-7,7,8,8-tetracyanoquinodimethane (F4-TCNQ). The other layers may consist of N,N'-Bis(3-methylphenyl)-N,N'-diphenylbenzidine (TPD), bisphenol A polycarbonate (PC), and (PTAA) polytriphenylamine. The diode would be Ag/F4-TCNQ/TPD:PC(1:1)/Ag. Another possibility would be Ag/F4-TCNQ/PTAA/Ag. The area of the TPD:PC diode is 1 $mm^2$ and the polymer thickness is about 400 nm. The area of the PTAA diode is 2.5 $mm^2$ and the PTAA layer thickness is about 1000 nm.

Figure 3:
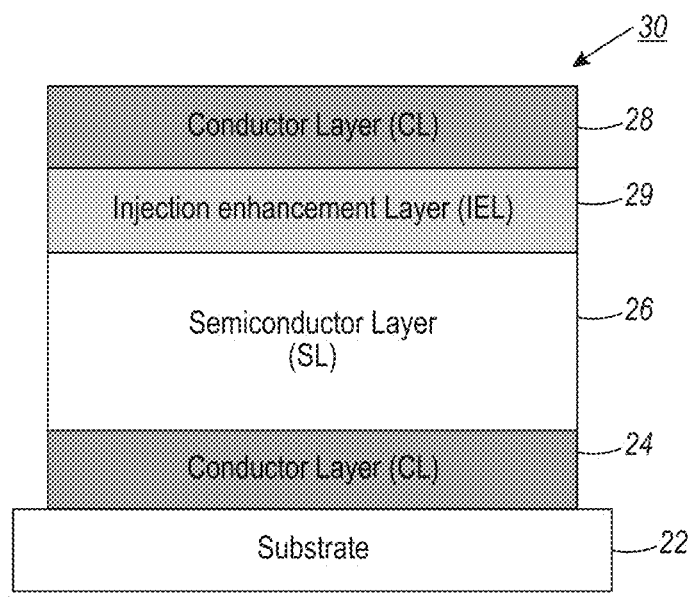
FIG. 3 shows another embodiment of an organic Schottky diode having an injection enhancement.
Figure 4:
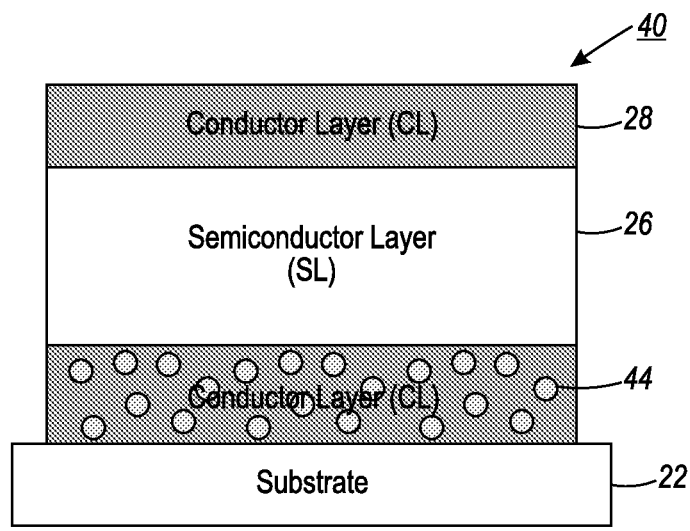
FIG. 4 shows another embodiment of an organic Schottky diode having an injection enhancement.
Figure 5:
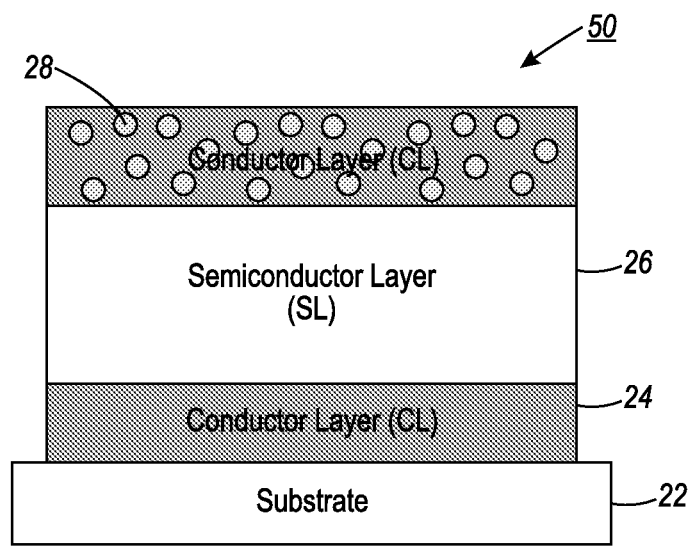
FIG. 5 shows another embodiment of an organic Schottky diode having an injection enhancement.

FIGS. 3-5 show alternative embodiments of the diode structure. In the diode 30, the injection enhancement layer 29 resides between the semiconductor layer 26 and the second conductor layer 28. In FIGS. 4 and 5, rather than an injection enhancement layer, it consists of an injection enhancement additive. The conductor is bulk modified by addition of the injection enhancement additive, which may consist of the same materials used in the injection enhancement layer. FIG. 4 shows a diode 40 has a lower conductor layer that has been bulk modified layer 44 by an injection enhancement additive on the substrate. FIG. 5 shows a diode 50 in which the bulk modified layer resides above the semiconductor layer. In either case, the additive is referred to as an injection enhancement, either in layer or additive form.

The manufacture of these diodes may take many forms. The metal conductor is deposited on the substrate. Typically, this may be accomplished using several different processes, but the materials used here are particularly useful for printing or other solution processing. In the case of the injection enhancement layer, the process will deposit it on either the conductor layer or the substrate depending upon the structure of the diode. With the injection enhancement additive, the solution used to form the conductor layer has the additive mixed into it prior to deposition.

Figure 6:
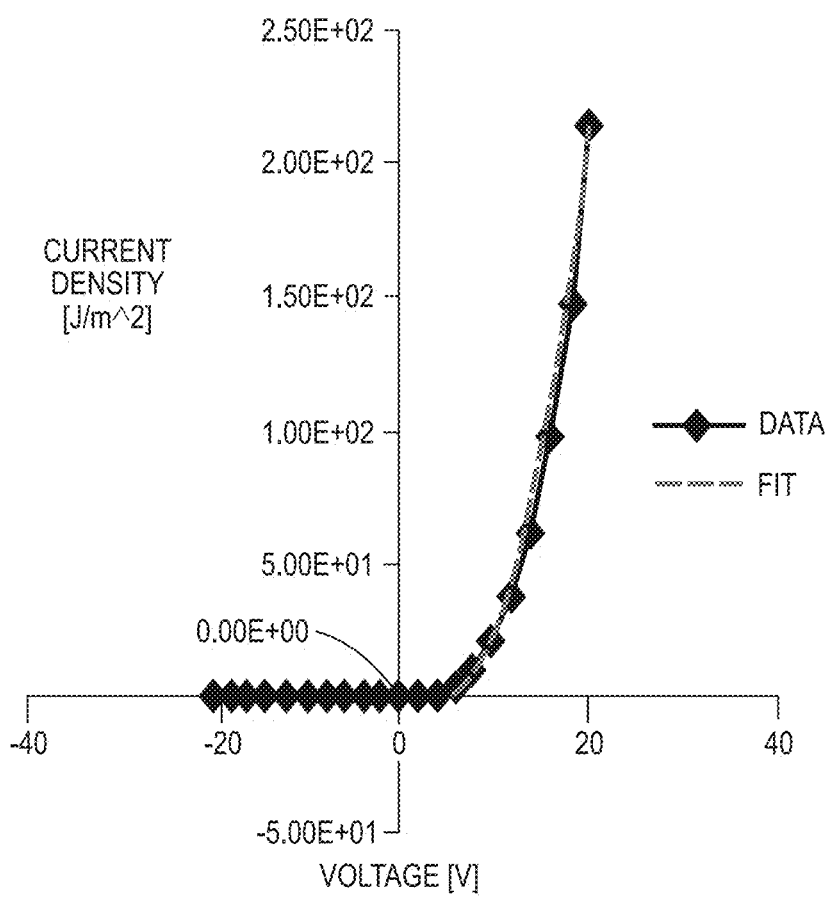
FIGS. 6 and 7 show linear plot and a log plot of voltage versus current density for a first embodiment of an organic Schottky diode.
Figure 7:
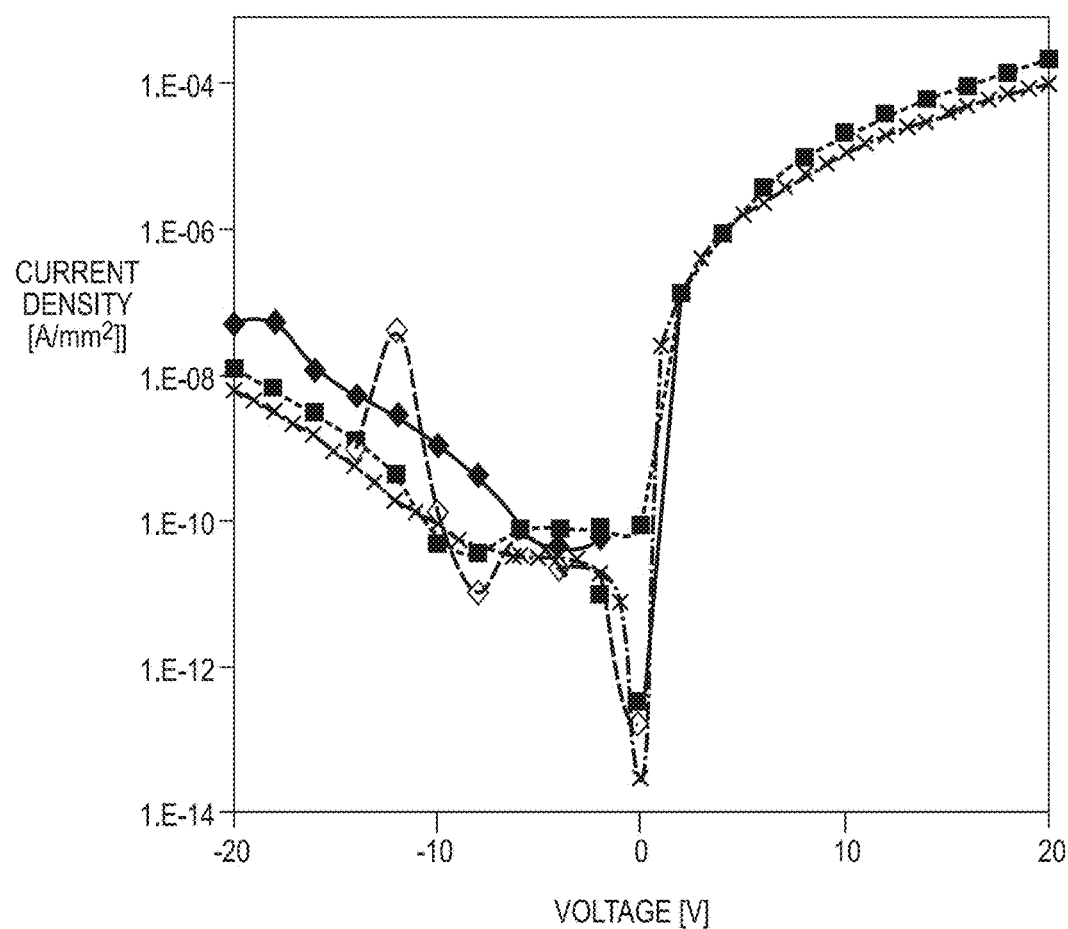
Figure 8:
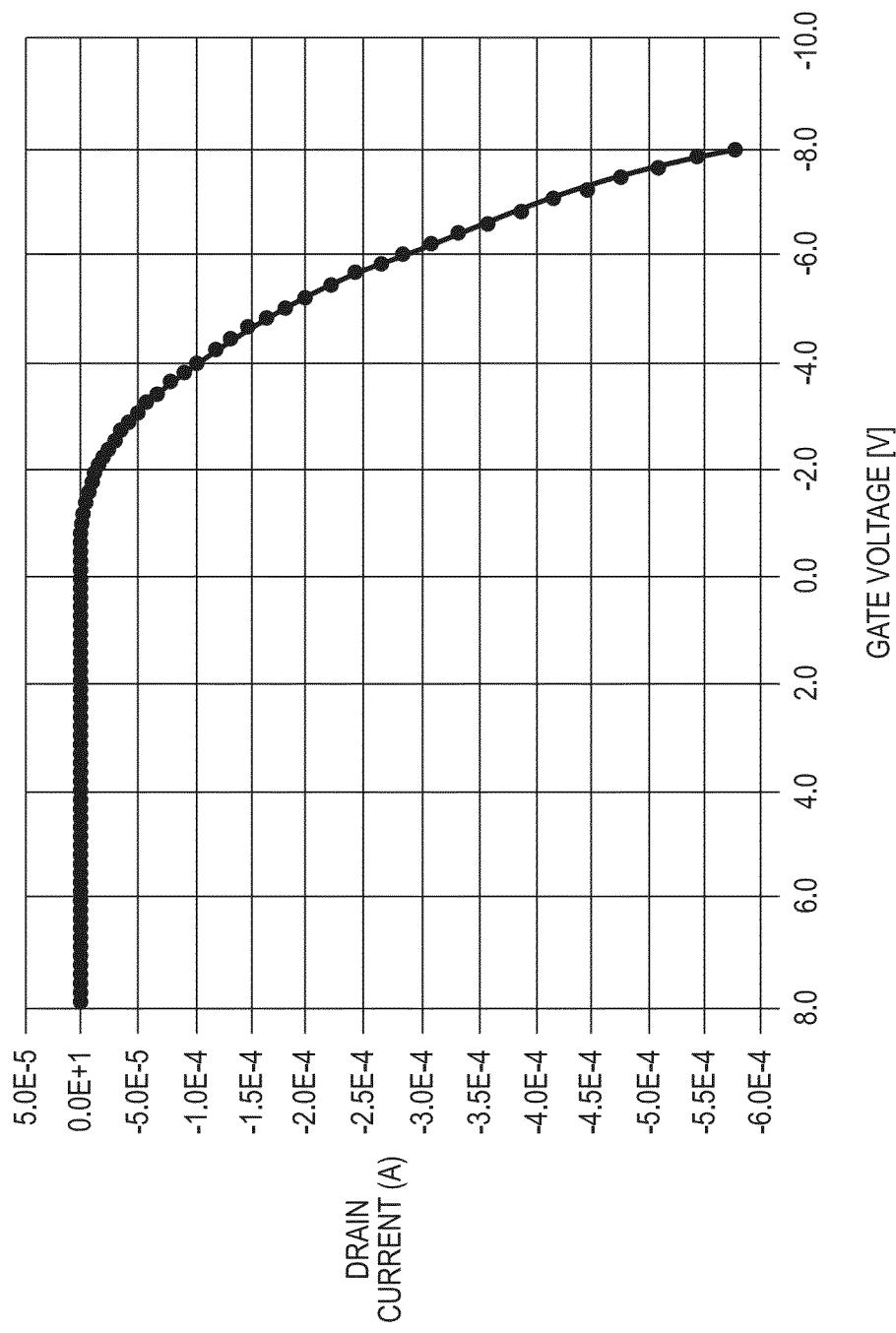
FIGS. 8 and 9 show linear plot and a log plot of voltage versus current density for a second embodiment of an organic Schottky diode.
Figure 9:
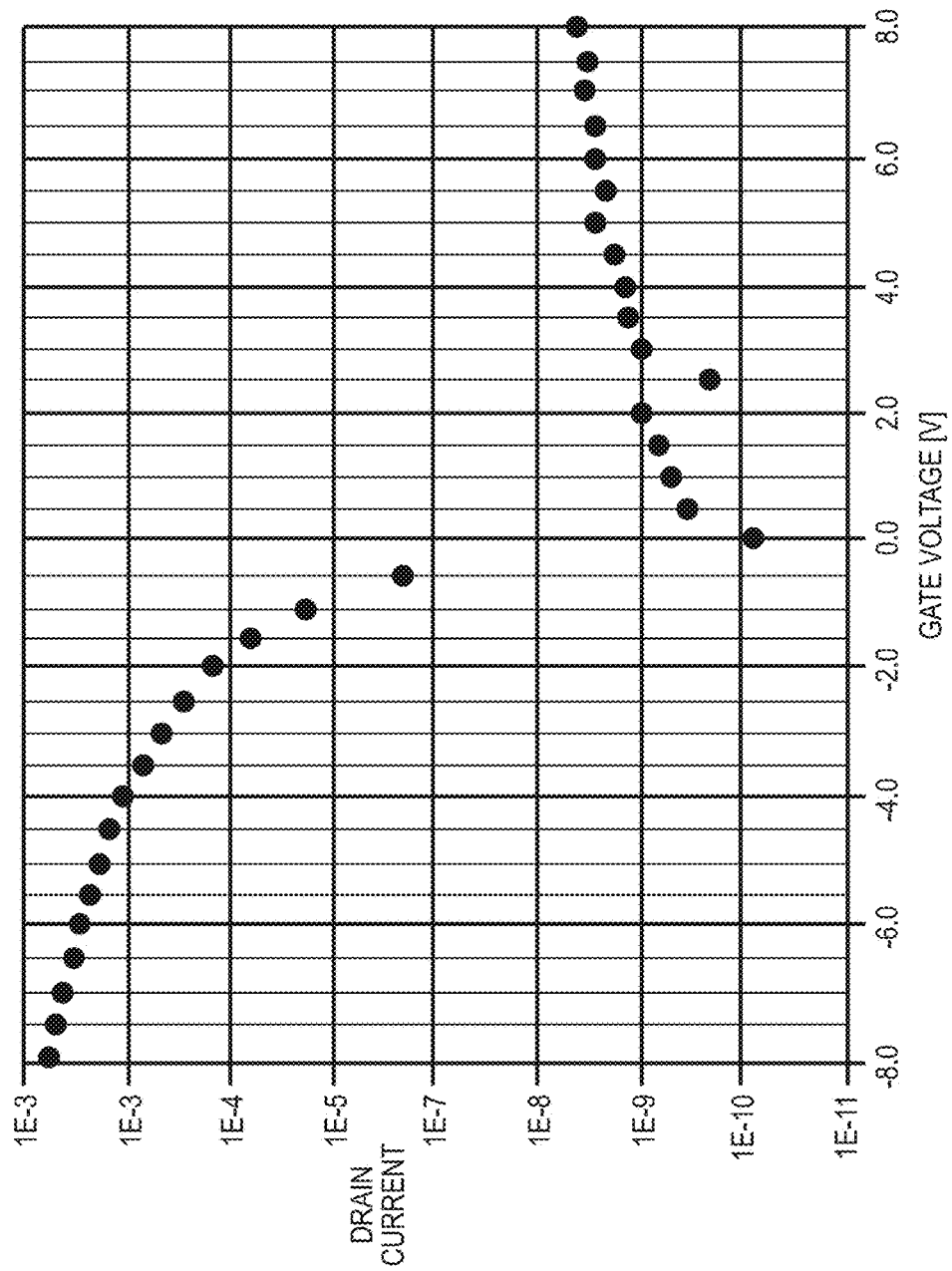

FIGS. 6 and 7 show the linear and log I-V plots for a diode consisting of Ag/F4-TCNQ/PTD:PC(1:1:)/Ag upon applying a forward bias showing at current density of $1.0 \times 10^{-5}$ $A/mm^2$ at 5 V. FIGS. 8 and 9 show linear and log I-V plots for a diode consisting of Ag/F4-TCNQ/PTAA/Ag. The plots show a rectifying effect upon applying a forward bias showing at a current density of $2.0 \times 10^4$ $A/mm^2$. The resulting performance of this diode is approximately better than that for the TPD:PC. Without the injecting material, the device does not rectify.

The resulting diodes having an injection enhancement layer or additive has several advantages over other organic semiconductor layer diodes. For example, most organic diodes use different electrode materials with different work functions. With the use of injection enhancement layer or additive, the diode has near Ohmic contact, enabling the use of identical electrode materials. In one embodiment, for example, both electrodes consist of silver in the bulk metal, but the additives are tuned to enhance or block the charge injection.

It will be appreciated that several of the above-disclosed and other features and functions, or alternatives thereof, may be desirably combined into many other different systems or applications. Also that various presently unforeseen or unanticipated alternatives, modifications, variations, or improvements therein may be subsequently made by those skilled in the art which are also intended to be encompassed by the following claims.

What is claimed is:

1. A method of printing a diode, comprising:
   printing a first conductor on a substrate from a first solution;
   depositing an organic semiconductor layer onto the first conductor such that the organic semiconductor layer resides on, and is in contact with, the first conductor; and
   printing a second conductor onto the organic semiconductor layer from a second solution, wherein at one least one of the first solution and the second solution has an injection enhancement material mixed into the solution.

2. The method of claim 1, wherein printing the first conductor comprises printing one of silver, gold, copper, nickel, aluminum, indium-tin-oxide, conductive carbon materials, and silver nanowires.

3. The method of claim 1, wherein forming the organic semiconductor layer comprises forming one of a pi conjugated polymer, poly(triarylamines), poly(phenylene vinylenes), poly(thiophenes), triarylamine containing polymers, ferrocene containing polymers, polysilanes, and triarylamine molecularly doped polymers.

4. The method of claim 1, wherein the injection enhancement material is one of the group consisting of: tetracyanoquinodimethane, a derivative of tetracyanoquinodimethane, lithium fluoride, lithium carbonate, cesium fluoride, and cesium carbonate.

5. The method of claim 1, wherein the first solution and the second solution are the same solution.

6. The method of claim 1, wherein only one of the first solution and the second solution has the injection enhancement material.

7. The method of claim 1, wherein both the first solution and the second solution have the injection enhancement material.

* * * * *